(12) United States Patent
Uratani et al.

(10) Patent No.: US 7,850,414 B2
(45) Date of Patent: Dec. 14, 2010

(54) LINEAR TRANSFER MECHANISM AND TRANSFER ROBOT USING THE SAME

(75) Inventors: Takafumi Uratani, Osaka (JP); Hirokazu Yoda, Osaka (JP); Daisuke Sado, Osaka (JP); Akira Okamoto, Osaka (JP)

(73) Assignee: Daihen Corporation, Osaka (JP)

( * ) Notice: Subject to any disclaimer, the term of this patent is extended or adjusted under 35 U.S.C. 154(b) by 666 days.

(21) Appl. No.: 11/879,613

(22) Filed: Jul. 18, 2007

(65) Prior Publication Data
US 2008/0023293 A1 Jan. 31, 2008

(30) Foreign Application Priority Data
Jul. 28, 2006 (JP) ............................. 2006-206179

(51) Int. Cl.
*B66C 23/00* (2006.01)
(52) U.S. Cl. .............. 414/744.2; 414/744.3; 198/750.2; 901/31; 74/490.01
(58) Field of Classification Search .............. 414/744.1, 414/744.2, 744.3, 744.5; 198/750.2; 901/30, 901/31; 74/479.01, 490.01
See application file for complete search history.

(56) References Cited
U.S. PATENT DOCUMENTS

| | | | |
|---|---|---|---|
| 5,135,349 A * | 8/1992 | Lorenz et al. | 414/744.6 |
| 6,026,949 A * | 2/2000 | Foster | 198/750.5 |
| 6,102,649 A * | 8/2000 | Ogawa et al. | 414/744.5 |
| 6,164,894 A * | 12/2000 | Cheng | 414/416.03 |
| 6,190,114 B1 * | 2/2001 | Ogawa et al. | 414/744.5 |
| 6,693,708 B1 * | 2/2004 | Hunter | 356/237.5 |
| 6,709,521 B1 * | 3/2004 | Hiroki | 118/719 |
| 7,114,907 B2 * | 10/2006 | Ogawa et al. | 414/744.5 |
| 7,264,436 B2 * | 9/2007 | Tillmann | 414/744.5 |
| 7,316,537 B2 * | 1/2008 | Park et al. | 414/744.1 |

FOREIGN PATENT DOCUMENTS

| | | |
|---|---|---|
| JP | 10-6258 | 1/1998 |
| JP | 2006-123135 | 5/2006 |

* cited by examiner

*Primary Examiner*—Douglas A Hess
(74) *Attorney, Agent, or Firm*—Hamre, Schumann, Mueller & Larson, P.C.

(57) ABSTRACT

A linear transfer mechanism includes a guide member, a transfer carriage movable along a horizontal linear transfer path provided on the guide member, and a drive mechanism provided with a drive pulley and an output belt wound around the drive pulley for reciprocating movement in a reciprocating movement section in parallel to the transfer path. The transfer mechanism also includes a drive source for driving the drive pulley. The transfer carriage is connected with the output belt of the drive mechanism by a connecting member. Both the drive mechanism and the drive source are supported by the guide member.

7 Claims, 8 Drawing Sheets

LINEAR TRANSFER MECHANISM AND TRANSFER ROBOT USING THE SAME

BACKGROUND OF THE INVENTION

1. Field of the Invention

The present invention relates to a linear transfer mechanism and also to a transfer robot incorporating a linear transfer mechanism. In particular, the present invention relates to a transfer robot configured to move thin works such as a substrate along a straight path.

2. Description of the Related Art

Conventional transfer robots include a type that incorporates a linear transfer mechanism for moving a hand or hands along a straight path. These robots, which are simpler in construction and less expensive than multi-joint robots, are widely used in the field of e.g. manufacturing semiconductor devices or liquid crystal display panels, in which thin works such as wafers and glass substrates are brought into and out of various process chambers.

The linear transfer mechanism used for these transfer robots may be of a link-arm type using a combination of two parallelogram links (see JP-A-H10-6258 for example). According to the link-arm type transfer mechanism disclosed in JP-A-H10-6258, the two parallelogram links are connected with each other via a gear mechanism. Specifically, when the first parallelogram link pivots through a predetermined angle, the gear mechanism causes the second parallelogram link to pivot through twice the angle. The second parallelogram link is provided, at an end thereof, with a hand for carrying a work. With such an arrangement, when the main shaft of the main link arm in the first parallelogram link is rotated, the hand moves along a linear path, with its orientation maintained, over a distance range, i.e. from the state shown in FIG. 1 of JP-A-H10-6258, in which the link arm is folded, to the state shown in FIG. 2, where the link arm is extended.

Recently, wafers used for making semiconductors tend to have larger diameters. Likewise, in the field of liquid crystal displays, the panel size tends to become larger. In light of these trends, the size of the robot's hand and the size of the work to be transferred have been increasing, the transfer path has been getting longer. However, these trends have caused a problem that a link arm such as the above-mentioned two parallelogram link type is distorted in the vertical direction by the weight of the work and the hand, especially when the link arm is extended. Unfavorably, this makes it difficult to provide an accurate linear transfer movement.

Another type of linear transfer mechanism is disclosed in JP-A-2006-123135. This linear transfer mechanism, which is of non-link-arm type, includes a pair of straight guide rails on which a transfer carriage is disposed to be driven by a belt drive mechanism. In this linear transfer mechanism, the transfer carriage is moved by the belt drive mechanism along a straight path on the guide rails. With this arrangement, it is possible to cope with the need for a longer transfer path simply by increasing the length of the guide rails.

JP-A-2006-123135 also discloses a transfer robot. This transfer robot, including the above-described linear transfer mechanism, is used for manufacturing processes of semiconductor devices or liquid crystal display panels. Specifically, the transfer robot is configured to move a work into and out of process chambers. The conventional transfer system disclosed in the document includes an atmospheric transfer module and a vacuum transfer module through which a work is moved into and out of each process chamber. The vacuum transfer chamber includes a transport chamber around which a plurality of process chambers are arranged, and a loadlock which connects the atmospheric transfer module and the transport chamber to each other. A linear transfer robot capable of operating in a vacuum is installed in the transport chamber. The linear transfer robot receives a work in the loadlock, brings the work into the transport chamber, and then puts it into a selected one of the process chambers. At the same time, the transfer robot takes a processed work out of the process chamber and transfers it back to the loadlock.

As shown in FIG. 5 of JP-A-2006-123135, the transfer robot includes a fixed base for supporting the linear transfer mechanism. The linear transfer mechanism is provided with a guide member which is rotatable about a swivel axis with respect to the base, and vertically movable along the axis. JP-A-2006-123135 also discloses another linear transfer mechanism including two transfer carriages (hands), one disposed above the other, each supported by a set of guide rails. These two transfer carriages are driven independently by the belt drive mechanism. With such an arrangement, since the two hands can be driven independently, it is possible to improve the work transfer efficiency with respect to the process chambers. The inside of the base is hermetically sealed from the outside. In the base, four motors are placed at appropriate positions serving as power sources for the sliding movement of the two transfer carriages driven by the linear transfer mechanism, the swivel movement of the guide member, and the vertical movement of the guide member. With this arrangement, even if the transfer robot is used in a vacuum, the power supplying motors are in a sealed space (the inside of the base) separate from the vacuum environment. This eliminates need to use motors such as those built specially for use in a vacuum, while offering an advantage of using ordinary motors which are made for use in normal atmospheric environment.

As described above, according to the linear transfer mechanism and the transfer robot disclosed in JP-A-2006-123135, a high level of efficiency is achieved by independent driving of the two hands and eliminating needs for special motors for use in a vacuum. On the other hand, the motors which drive the transfer carriages are housed inside the fixed base, and the transfer carriages which receive the driving power from the motor make their travel on a straight path on the guide member supported by the base. With this arrangement, the drive mechanism that transmits the drive power from the motor to the transfer carriages needs to transmit the power over a long distance, and its structure tends to become complicated. Also, the long power transmission route may give rise to a greater power transmission loss in the drive mechanism.

SUMMARY OF THE INVENTION

The present invention has been proposed under the above-described circumstances. It is therefore an object of the present invention to provide a linear transfer mechanism capable of ensuring an accurate linear transfer path with a simple structure, and a transfer robot including the linear transfer mechanism and suitable for use in a vacuum.

According to a first aspect of the present invention, there is provided a linear transfer mechanism comprising: a guide member; a transfer carriage movable along a horizontal linear transfer path provided on the guide member; a drive mechanism including a drive pulley and an output belt wound around the drive pulley for reciprocating movement in a predetermined reciprocating movement section in parallel to the transfer path; and a drive source for driving the drive pulley. The transfer carriage is connected with the output belt of the drive mechanism by a connecting member. Both the drive mechanism and the drive source are supported by the guide member.

Preferably, the drive source may be adjacent to the transfer carriage.

The linear transfer mechanism of the present invention makes use of a belt drive mechanism. Advantageously this feature enables one to readily deal with an increased travel distance of the transfer carriage. Further, since both the drive mechanism and the drive source are supported by the guide member, these two units can be disposed adjacent to each other, which contributes to simplification of the structure of a belt drive mechanism from the drive source to the transfer carriage. Specifically, a motor (an example of the drive source) and a drive pulley (a constituent part of the drive mechanism) maybe disposed close to each other. In this instance, the drive pulley may be connected directly or via a simple reduction mechanism with the output shaft of the drive source motor. With such an arrangement, it is possible to shorten the power transmission route from the drive source to the transfer carriage, thereby reducing power transmission loss in the drive mechanism. Accordingly the drive source may have a small output capacity, which then contributes to space saving and power saving. Another advantage of disposing the drive source near the transfer carriage is that the linear transfer mechanism occupies only a smaller space.

Preferably, the drive mechanism may include a tensioner for tensioning the output belt.

With this arrangement, it is possible to ensure a reliable operation of the belt drive mechanism while simplifying the structure of the drive mechanism.

Preferably, the transfer carriage may comprise a first transfer carriage and a second transfer carriage each supported by the guide member and movable along the transfer path without interfering with each other. The drive mechanism may comprise a first drive mechanism and a second drive mechanism provided at the guide member for driving the first transfer carriage and the second transfer carriage respectively. The drive source may comprise a first drive source and a second drive source for driving the first drive mechanism and the second drive mechanism respectively.

In an embodiment of the present invention, the guide member may comprise a pair of first guide rails and a pair of second guide rails, where the first guide rails are configured to flank the transfer path and to movably support the first transfer carriage, and where the second guide rails, positioned on the outer sides of the first guide rails, are also configured to flank the transfer path and to movably support the second transfer carriage.

In another embodiment of the present invention, each of the first and second transfer carriages may comprise a main plate portion, where the main plate portion of the second transfer carriage is arranged above the main plate portion of the first transfer carriage, and where the second transfer carriage is supported by the second guide rails via a pair of support arms which extend from the sides of the main plate portion of the second transfer carriage and detour around the sides of the main plate portion of the first plate portion.

Preferably, the first drive source and the second drive source may be spaced from each other in a direction parallel to the transfer path.

With the above arrangement, the weight of the guide member is well balanced, so that deformation of the guide member is prevented. Further, the first and second drive mechanisms can be arranged symmetrically with respect to the center of the guide member to correspond to the positions of the drive sources. In this instance, the two driving mechanisms may be the same in structure so as to cut down the production cost.

According to a second aspect of the present invention, there is provided a transfer robot incorporating the above-described linear transfer mechanism. The transfer robot further includes a fixed base supporting the linear transfer mechanism in a manner such that the transfer mechanism is rotatable about a vertical swivel axis in the transfer path, and a hand provided on the transfer carriage and configured to carry a thin work.

In an embodiment of the present invention, the linear transfer mechanism may be movable up and down along the swivel axis.

Preferably, the transfer robot may further comprise a housing for containing the drive source in a hermetically sealed state, wherein the housing is connected to a channel for communicating with the fixed base with the hermetically sealed state maintained.

With the above arrangement, when the transfer robot is used in a vacuum, the drive sources can be installed in a normal atmospheric condition in the housing, which is sealed against the vacuum environment. Further, it is possible to extend a power cable for the drive source into the fixed base via the channel.

Other features and advantages of the present invention will become apparent from the detailed description given below with reference to the accompanying drawings.

DETAILED DESCRIPTION OF THE PREFERRED EMBODIMENTS

Preferred embodiments of a linear transfer mechanism according to the present invention and a transfer robot using the same transfer mechanism will be described below with reference to the drawings.

FIG. 1 through FIG. 8 show a transfer robot according to the present invention. As shown in FIG. 1 through FIG. 4, a transfer robot A1 includes a linear transfer mechanism B1. The transfer mechanism B1 is rotatable relative to a fixed base 200 about a swivel axis Os, while also being vertically movable. The linear transfer mechanism B1 generally includes a table-like guide member 1, and two transfer carriages 2A, 2B which are movable along a horizontal linear transfer path GL arranged on the guide member 1. The first transfer carriage 2A and the second transfer carriage 2B are provided with hands 21a, 21b respectively, for carrying a thin work W such as a glass substrate to be used for a liquid crystal panel.

Figure 5:
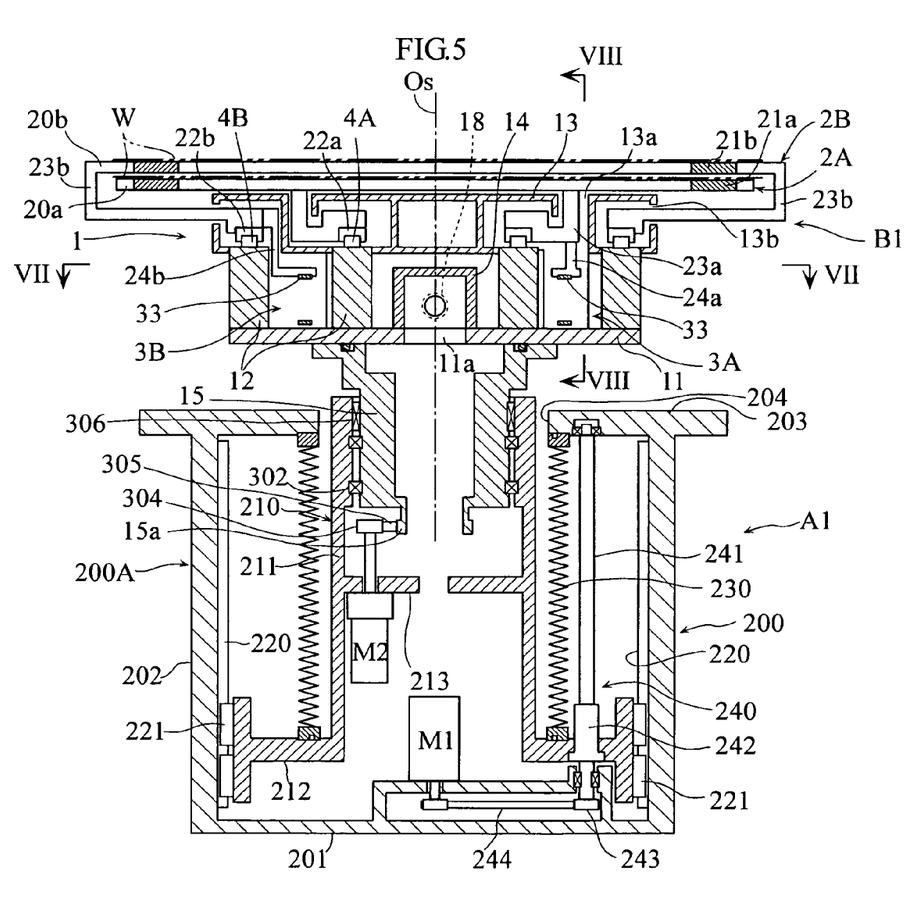
FIG. 5 is a sectional view taken along lines V-V in FIG. 2.

As clearly shown in FIG. 5, the fixed base 200 includes a generally cylindrical housing 200A which is made up of a bottom wall portion 201, a cylindrical side wall portion 202 and a ceiling wall 203. The ceiling wall 203 has a center opening 204. Inside the fixed base 200, there is a vertically movable lift base 210. The lift base 210 includes a cylindrical portion 211 whose outer diameter is smaller than the diameter of the center opening 204, and has an outward extending flange portion 212 formed at the lower end of the cylindrical portion 211. The cylindrical side wall portion 202 has an inner wall to which a plurality of vertical, straight guide rails 220 are attached. A plurality of guide members 221 are provided on the flange portion 212 of the lift base 210 in a manner such that they are vertically movable relative to the straight guide rails 220. With this arrangement, the lift base 210 can be moved vertically, i.e. upward and downward, with respect to the fixed base 200, until the top of the cylindrical portion 211 of the lift base 210 comes to a position higher than the center opening 204 of the housing 200A or to a position lower than the opening 204. A bellows 230, surrounding the cylindrical portion 211 of the lift base 210, has one end connected to the ceiling wall 203 of the fixed base 200 and the other end connected to the flange portion 212 of the lift base 210. While the lift base 210 is vertically moved, the bellows 230 ensures the air-tight sealing between the ceiling wall 203 of the fixed base 200 and the flange portion 212 of the lift base 210.

Also provided inside the fixed base 200 is a ball screw mechanism 240 which includes a rotatable, vertical threaded shaft 241 arranged on the outside of the bellows 230, and a nut member 242 engaging with the threaded shaft 241. The nut member 242 is fixed to the flange portion 212 of the lift base 210, vertically extending through the flange portion 212. The threaded shaft 241 has a lower end provided with a pulley 243, and this pulley is connected to the a motor M1 via a belt 244. The motor M1 drives the shaft in forward and reverse directions. The rotation of the threaded shaft 241 causes the lift base 210 to go up or down.

The linear transfer mechanism B1, rotatable about the swivel axis Os, is rotatably supported on the lift base 210. The linear transfer mechanism B1 has a lower cylindrical portion 15 which is rotatably supported inside the cylindrical portion 211 of the lift base 210 via a bearing 302. The cylindrical portion 15 has a lower end formed integral with a pulley 15a. A belt 305 connects the pulley 15a with a pulley 304 which is attached to the output shaft of a motor M2 supported on a middle wall 213 of the cylindrical portion 211 in the lift base 210. With this arrangement, when the motor M2 is driven, the linear transfer mechanism B1 is rotated about the swivel axis Os. A sealing unit 306 is placed above the bearing 302 and between the cylindrical portion 211 of the lift base 210 and the cylindrical portion 15 of the linear transfer mechanism B1.

As shown in FIG. 5, the linear transfer mechanism B1 includes a guide member 1, a pair of first guide rails 4A and a pair of second guide rails 4B supported by the guide member 1. It should be noted here that the operation state shown in FIG. 5 and FIG. 6 differs from that shown in FIG. 2. Specifically, the transfer robot A1 shown in these figures is in a state where both the first transfer carriage 2A and the second transfer carriage 2B are positioned immediately above the fixed base 200. The guide member 1 includes a bottom wall 11, four vertical walls 12, and a cover 13. The bottom wall 11 is fixed to the cylindrical portion 15 with airtight sealing provided by a seal member such as an O ring between the cylindrical portion 15 and the bottom wall 11. The bottom wall 11 has its central portion formed with a through-hole 11a which communicates with the inside of the fixed base 200 via the cylindrical portion 15. A housing 14 is placed on the bottom wall 11 to cover the through-hole 11a, with air-tight sealing provided by a seal member (not illustrated) such as an O ring between the housing 14 and the bottom wall 11. The vertical walls 12 provide support to the guide rails 4A, 4B, have a predetermined length along a line parallel to the transfer path GL, and are built with e.g. extruded aluminum members (aluminum profile) laid one upon another to a predetermined height and then connected with each other. The first guide rails 4A are laid on an inner pair of the vertical walls 12, to sandwich the transfer path in parallel thereto. The second guide rails 4B are laid on an outer pair of the vertical walls 12, to sandwich the transfer path GL in parallel thereto. The first guide rails 4A support the first transfer carriage 2A via sliders 22a provided on the bottom of the carriage, movably along the transfer path GL. The second guide rails 4B support the second transfer carriage 2B via sliders 22b, movably along the transfer path GL. Each pair of the guide rails 4A, 4B are covered by the cover 13 from above.

Figure 1:
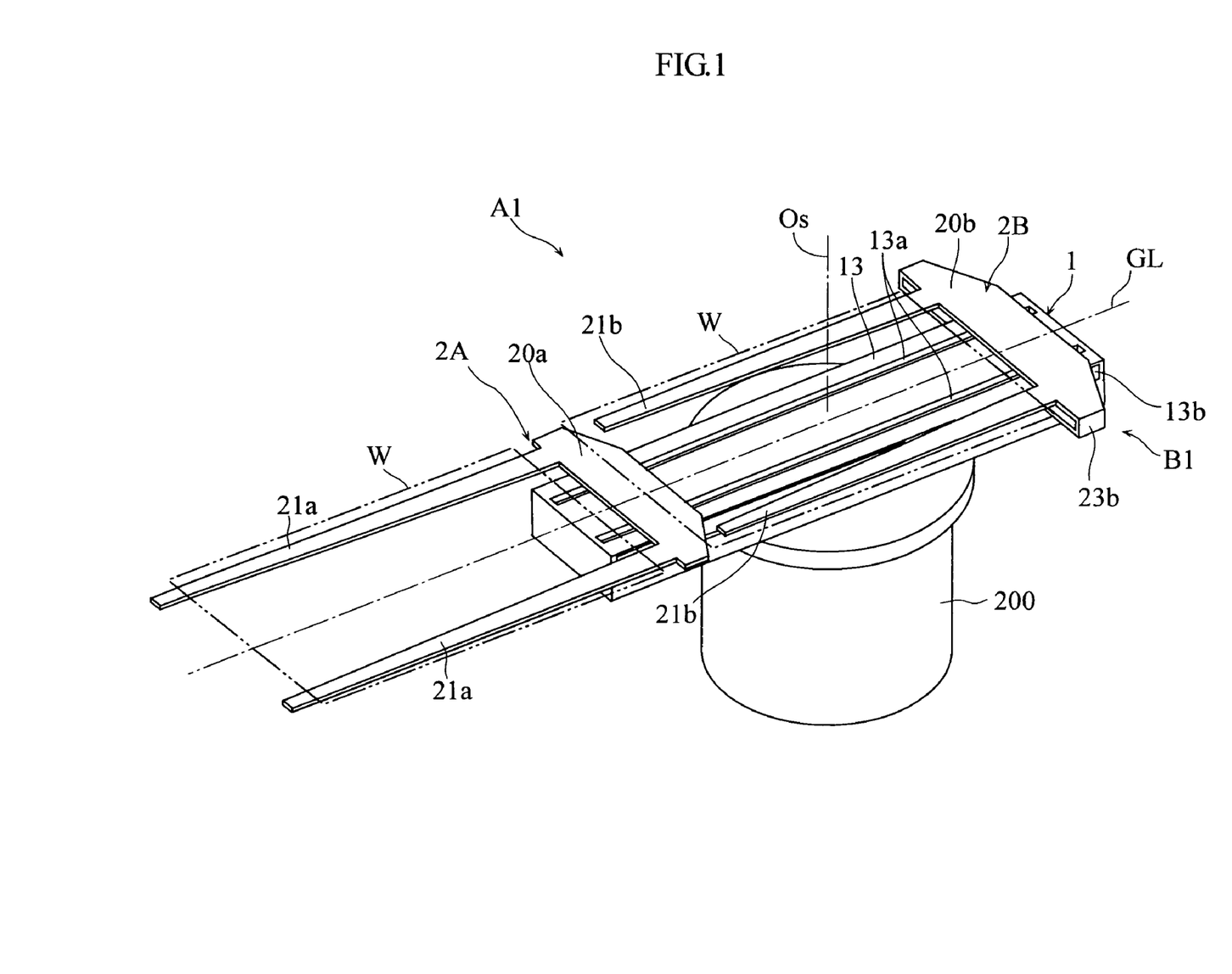
FIG. 1 is a perspective view showing a transfer robot according to the present invention.
Figure 2:
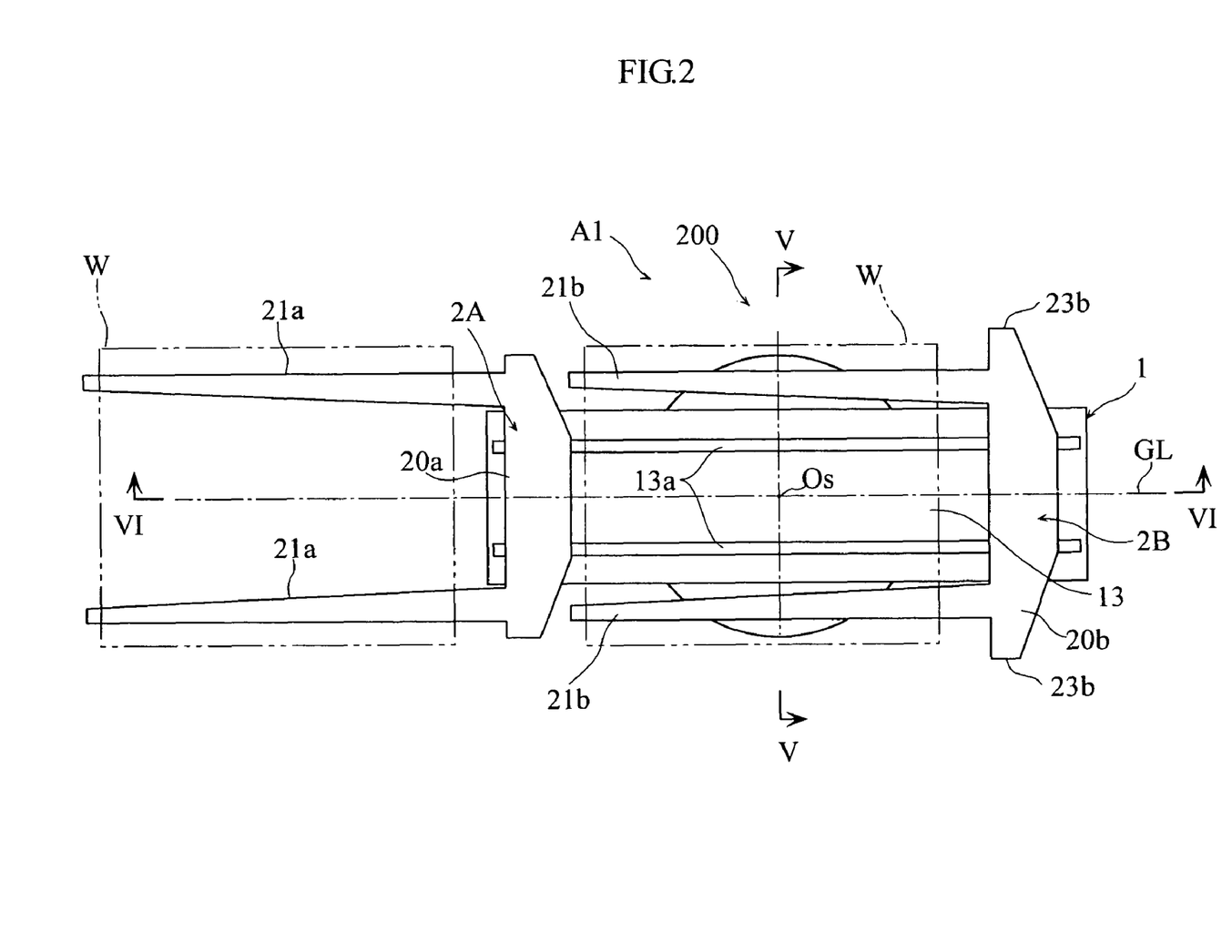
FIG. 2 is a plan view showing the transfer robot of FIG. 1.
Figure 3:
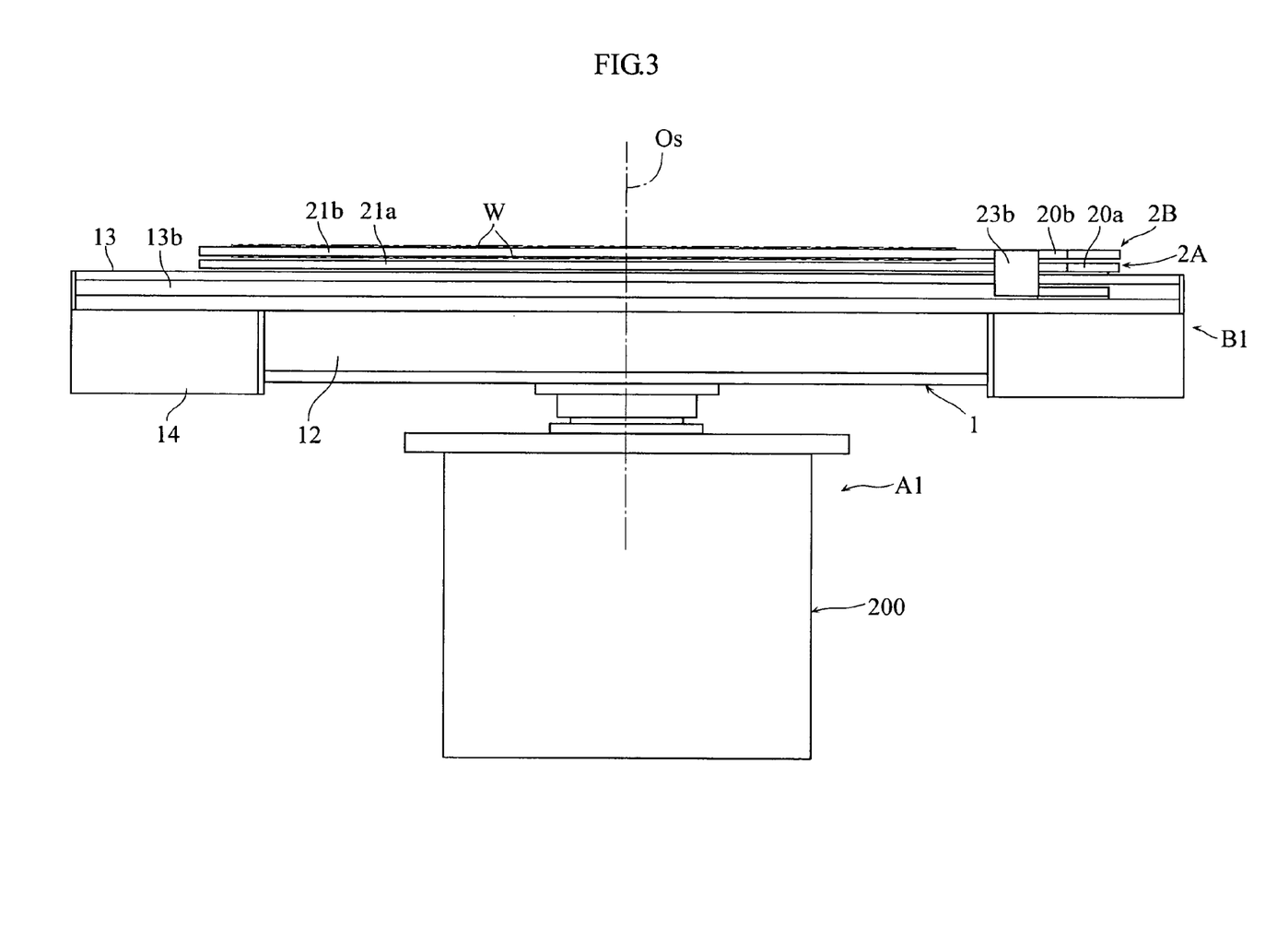
FIG. 3 is a side view showing the transfer robot of FIG. 1.
Figure 4:
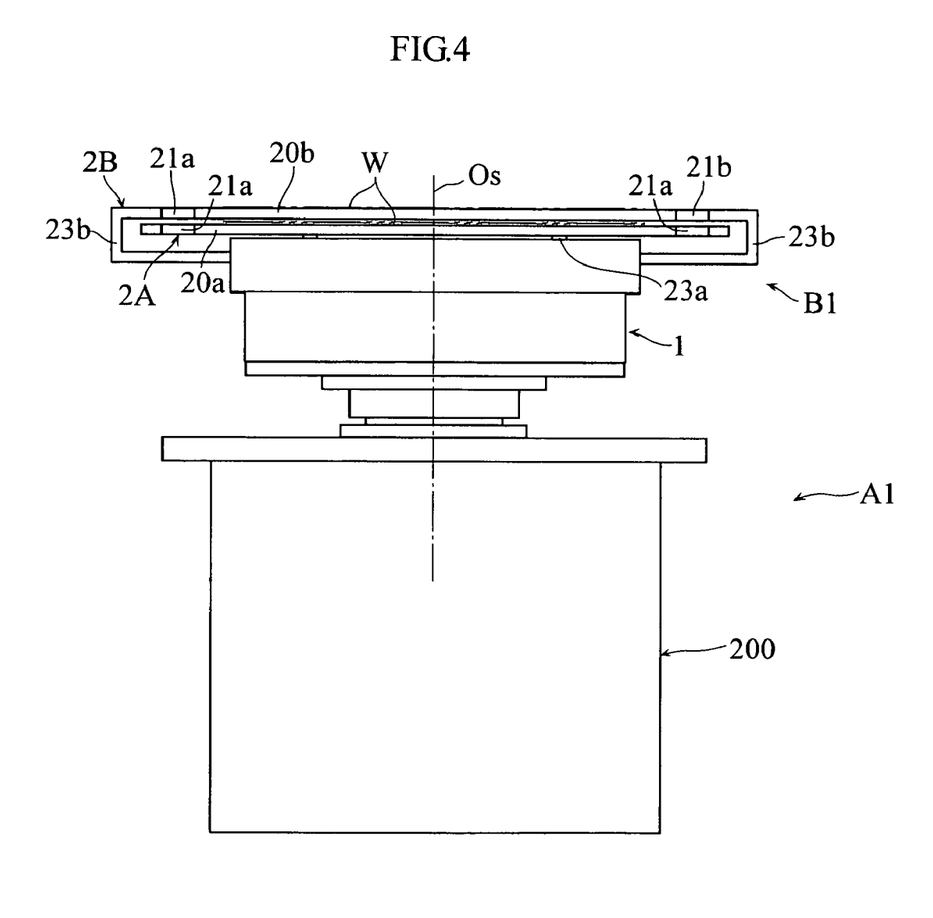
FIG. 4 is a front view showing the transfer robot of FIG. 1.

As shown in FIG. 1 and FIG. 2, the first transfer carriage 2A and the second transfer carriage 2B have horizontal main plate portions 20a, 20b respectively, each having a predetermined width across the guide member 1. As shown in FIG. 3 and FIG. 4, the main plate portions 20a, 20b are positioned in such a way that one is above the other, whereby each can move along the transfer path GL without interference with the other.

As shown in FIG. 5, the main plate portion 20a of the first transfer carriage 2A is supported by a pair of second guide rails 4A via the above-mentioned support arms 23a formed on a lower surface of the main plate portion and the above-mentioned pair of right and left sliders 22a provided on the lower surface of the support arms 23a. On the other hand, the main plate portion 20b of the second transfer carriage 2B is supported by a pair of second guide rails 4B via a pair of support arms 23b and sliders 22b provided on the support arms 23b, where the support arms 23b extend from the sides of the portion 20b to detour around the sides of the main plate portion 20a of the first transfer carriage 2A. Thus, the first transfer carriage 2A and the second transfer carriage 2B can move along the transfer path GL without suffering any interference with each other. Further, since their main plate portions 20a, 20b are supported on their both ends by the first guide rails 4A and the second guide rails 4B, stable supporting is achieved. It should be noted here that in the first transfer carriage 2A, the support arms 23a extend through slits 13a formed in the upper surface of the cover 13. The support arm 23a shown on the right-hand side in the figure is provided with a connecting member 24a. The connecting member 24a is connected with an output belt 33 of the first drive mechanism 3A to be described later. Likewise, in the second transfer carriage 2B, the support arms 23b extend through slits 13b formed in the side surfaces of the cover 14. The support arm 23b shown on the left-hand side in the figure is provided with a connecting member 24b. The connecting member 24b is connected with an output belt 33 of the second drive mechanism 3B to be described later.

As shown in FIG. 1 through FIG. 3, the main plate portions 20a, 20b are provided respectively with fork-like hands 21a, 21b formed integrally therewith and extending longitudinally of the guide member 1. These hands 21a, 21b can carry relatively large, thin, plate-like works W such as glass substrates to be used for manufacture of liquid crystal display panels.

Figure 6:
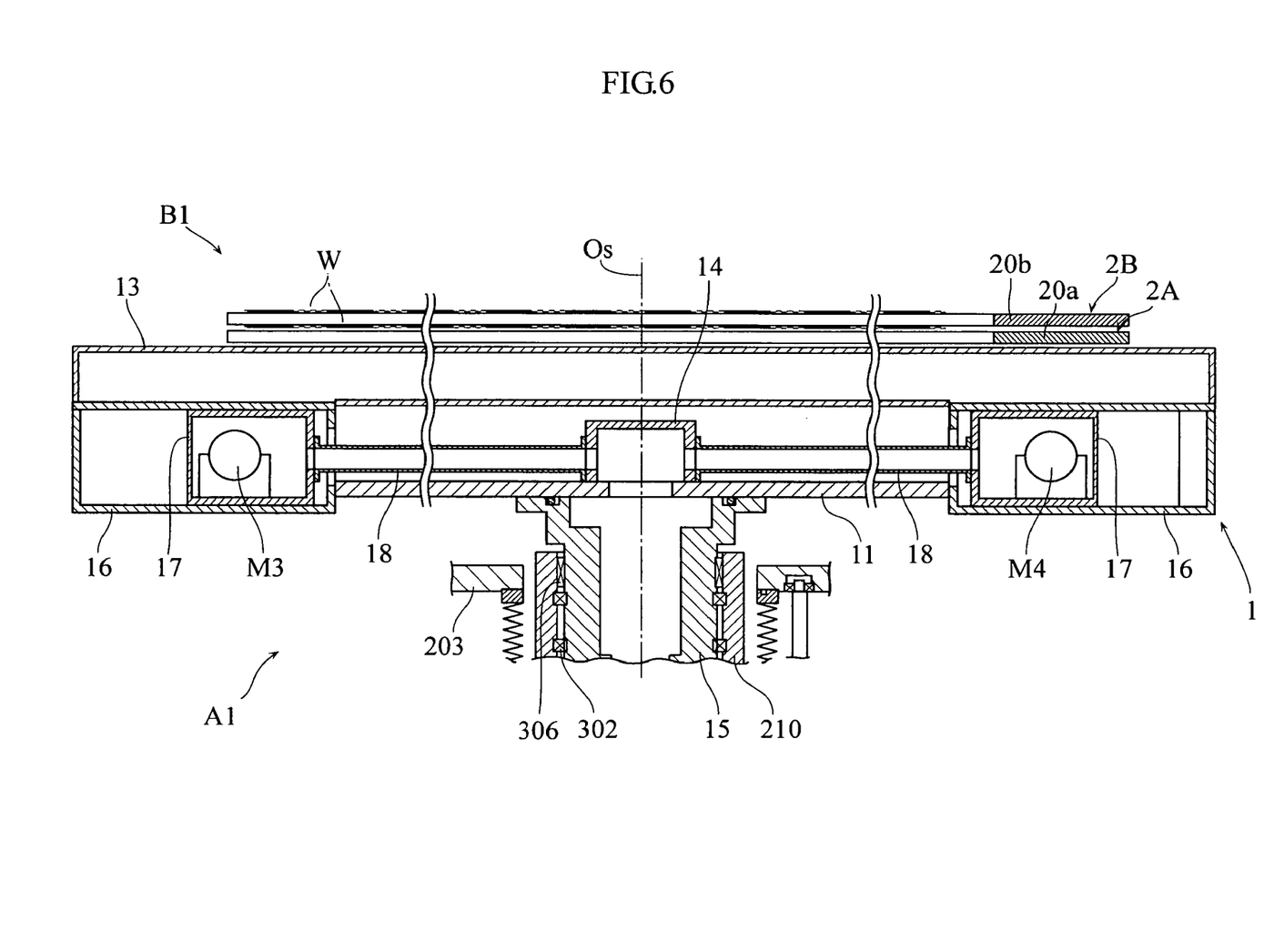
FIG. 6 is a sectional view taken along lines VI-VI in FIG. 2.
Figure 7:
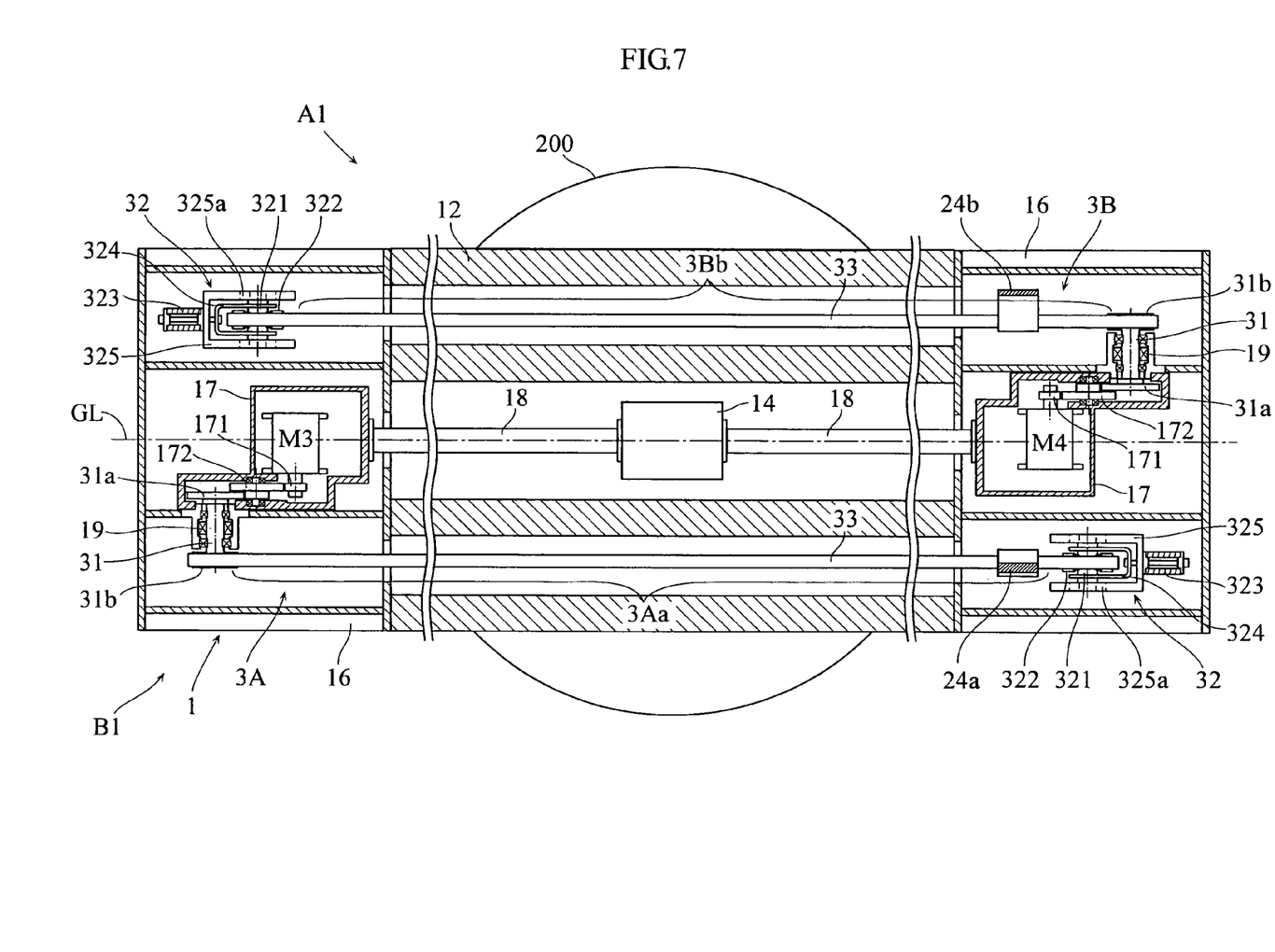
FIG. 7 is a sectional view taken along lines VII-VII in FIG. 5.

As clearly seen in FIG. 6 or FIG. 7, a box-like, bottomed bracket 16 is provided at each longitudinal end of the guide member 1, abutting end surfaces of the vertical walls 12. These brackets 16 support a pair of motor housings 17, the first drive mechanism 3A, and the second drive mechanism 3B. The motor housing 17 on the left-hand side in the figure houses a motor M3 serving as a first drive source whereas the motor housing 17 on the right-hand side in the figure houses a motor M4 serving as a second drive source. Each of the motor housings 17 is connected with a tube 18 through which a power supply cable (not illustrated) is laid for the motor M3 or the motor M4. The tubes 18 communicate with the housing 14 provided on the bottom wall 11 in the guide member 1, and seal members such as O rings (not illustrated) provide air-tight sealing between the motor housings 17 and the tubes 18, as well as between the tubes 18 and the housing 14.

Each motor housing 17 is provided with a transmission shaft 31. The transmission shaft 31 has an end provided with a gear 31a which receives power from the motor M3 or the motor M4 via a set of a gear 171 and a reduction gear 172 attached to an output shaft of the motor M3 or the motor M4. Each transmission shaft 31 has its other end extended out of the motor housing 17, and a sealing unit 19 such as a magnetic fluid unit is placed between the transmission shaft 31 and the motor housing 17. The sealing unit 19 provides air-tight sealing between inside and outside of the motor housing 17. The inside space of the motor housing 17 communicates with the inside space of the under air-tight sealing via the tube 18 and the housing 14. Therefore, this continuous space provides a closed environment which is entirely sealed from the outside. Thus, even if the transfer robot A1 is used in a vacuum, the motors M1, M2 placed in the fixed base 200 and the motors M3, M4 placed in the respective motor housings 17 are in an air-tight space sealed from the vacuum environment, which means these motors need not be special motors such as those built specifically for use in a vacuum, but may be ordinary motors made for use in normal atmospheric environment.

The first drive mechanism 3A and the second drive mechanism 3B are configured to move the first transfer carriage 2A and the second transfer carriage 2B respectively and independently from each other along the transfer path GL. Since the first drive mechanism 3A and the second drive mechanism 3B have the same construction, the construction of the first drive mechanism 3A will be mainly described, while the description of the second drive mechanism 3B may be omitted appropriately.

The first drive mechanism 3A includes the transmission shaft 31, a tensioner 32 and the output belt 33. The transmission shaft 31 is rotatably supported by the motor housing 17 via a bearing. The transmission shaft 31 has an end formed integral with a drive pulley 31b. The tensioner 32 is supported by the bracket 16 shown on the right-hand side in FIG. 7. The tensioner 32 includes: a support shaft 321; a pulley 322 rotatably inserted around the support shaft 321 via a bearing; an urging member 323 provided by a coil spring; a connecting member 324 which provides integral connection between the urging member 323 and the support shaft 321; and a support plate 325 which has a generally U-shaped plan view. The support shaft 321 is inserted through a pair of long holes 325a which are made in parallel to the transfer path GL in the support plate 325. Thus, the support shaft 321 is supported slidably with respect to the support plate 325 within a predetermined range in parallel to the transfer path GL. The support shaft 321 is under an appropriate urge provided by the urging member 323, in the direction away from the drive pulley 31b of the transmission shaft 31. The output belt 33 is routed around the drive pulley 31b of the transmission shaft 31 and the pulley 322 of the tensioner 32. With this arrangement, the output belt 33 is under an appropriate tension provided by the tensioner 32. The output belt 33 is suitably provided by e.g. a timing belt.

Figure 8:
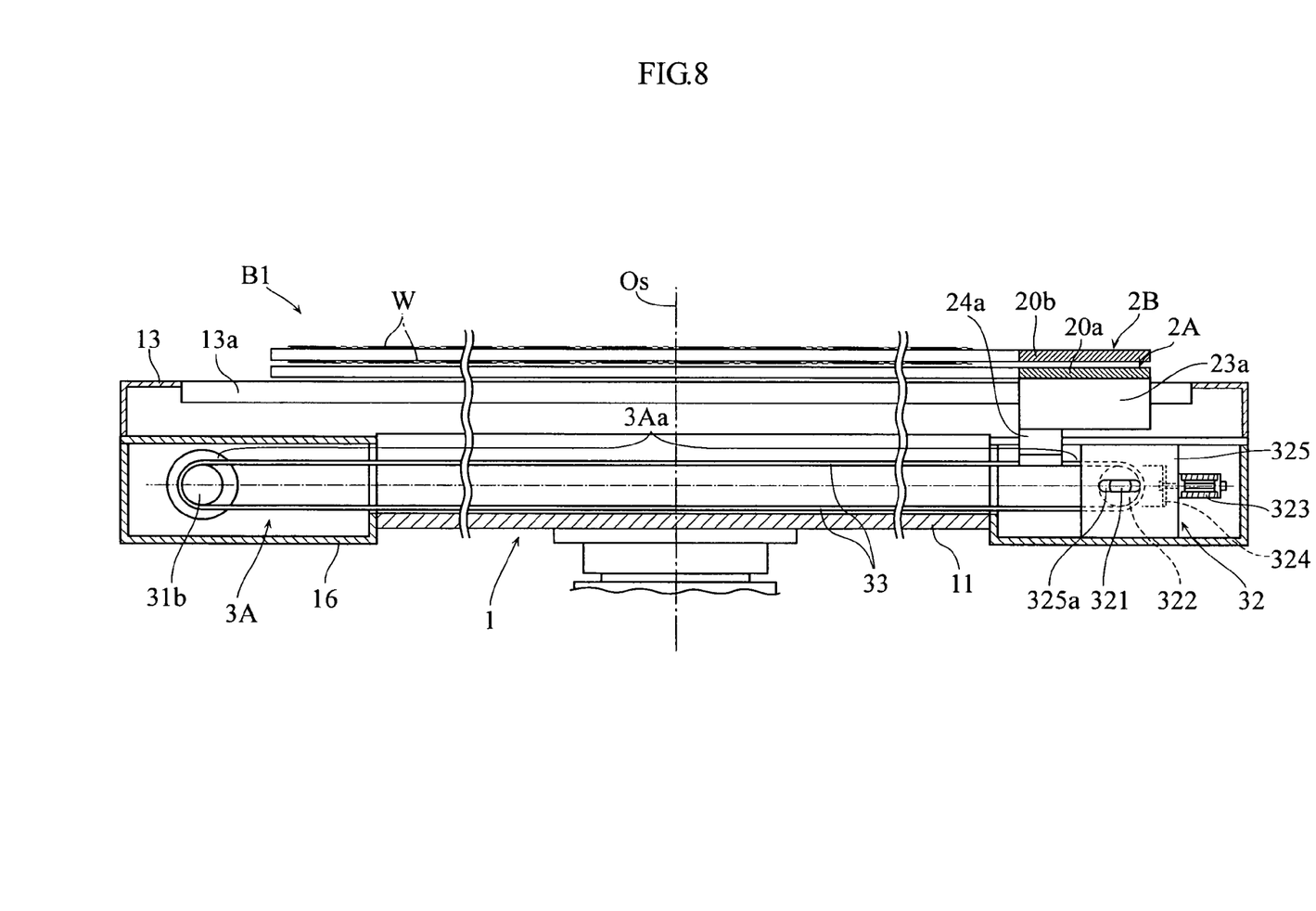
FIG. 8 is a sectional view taken along lines VIII-VIII in FIG. 5.

As clearly shown in FIG. 7 or FIG. 8, the first drive mechanism 3A is disposed in parallel to the transfer path GL, and closely to the first transfer carriage 2A. In this layout, a region along the output belt 33 and above the drive pulley 31b is defined as a section 3Aa which is parallel to the transfer path GL and close to the first transfer carriage 2A, and the output belt 33 can make reciprocating movement in this section. In the section 3Aa, the output belt 33 has a predetermined portion connected with the connecting member 24a extending from the support arm 23a of the first transfer carriage 2A. As a result, the first transfer carriage 2A is reciprocable by the first drive mechanism 3A along the transfer path GL.

The second drive mechanism 3B is essentially identical with the first drive mechanism 3A in its construction: The two mechanisms are disposed in a point-symmetry relationship, i.e. 180-degree-rotation relationship, with respect to the center of guide member 1. In other words, as clearly shown in FIG. 7, the second drive mechanism 3B is the first drive mechanism 3A which is rotated by 180 in a plan view, and thus, the transmission shaft 31 of the second drive mechanism 3B is on the right-hand side in the figure whereas the tensioner 32 of the second drive mechanism 3B is in the left-hand side of the figure. In the second drive mechanism 3B, a region along the output belt 33 above the drive pulley 31b is defined as Section 3Bb which is parallel to transfer path GL and close to the second transfer carriage 2B, and the output belt 33 is reciprocable in this section. In the section 3Bb, the output belt 33 has a predetermined portion connected with the connecting member 24b extending from the support arm 23b of the second transfer carriage 2B. As a result, the second transfer carriage 2B is reciprocable by the second drive mechanism 3B along the transfer path GL.

Next, the function of the transfer robot A1 will be described.

When the motor M3 drives, the driving power is transmitted via the gear 172 to the first drive mechanism 3A, to move the first transfer carriage 2A on the transfer path GL. On the other hand, when the motor M4 drives, the driving power is transmitted via the gear 172 to the second drive mechanism 3B, to move the second transfer carriage 2B on the transfer path GL. The first transfer carriage 2A and the second transfer carriage are designed not to interfere with each other. Therefore, it is possible to move the first transfer carriage 2A and the second transfer carriage 2B independently from each other. For example, as shown in FIG. 1, the second transfer carriage 2B may be placed at a stand-by position above the fixed base 200 while the first transfer carriage 2A is moved along the transfer path GL to a forward position for receiving/delivering a work W by the first transfer carriage 2A. Also, under this state, it is possible to keep another work W on the second transfer carriage 2B. On the contrary, the second transfer carriage 2B may be placed at the forward position to receive/deliver a work W while the first transfer carriage 2A is placed at the stand-by position with another work W kept thereon. As described above, the transfer robot A1 can hold two works W simultaneously, and to receive/deliver each work independently from each other. This provides flexibility in transportation of wafers in manufacturing processes of semiconductors or in transportation of glass substrates in manufacturing processes of liquid crystal display panels, thereby improving manufacturing efficiency.

Further, according to the transfer robot A1, the linear transfer mechanism B1 can swivel and rise/lower with respect to the fixed base 200. This feature is suitable for manufacturing equipment which includes a transport chamber and a plurality of process chambers radially placed around and connected with the transport chamber, with the fixed base 200 of the transfer robot A1 being placed in the transport chamber. In such a layout as described above, by appropriately swiveling the linear transfer mechanism B1 of the transfer robot A1, the hands 21a, 21b can be extended into whichever of the process chambers to receive/deliver works W. Also, it is possible to raise or lower the works W appropriately in each process chamber in accordance with a height required in the specific process to be performed. Therefore, the transfer robot A1 is suitable to save space for the manufacturing equipment, to increase versatility and efficienly in the manufacturing processes.

According to the present embodiment, the distance of reciprocating travel performed by the first transfer carriage 2A and the second transfer carriage 2B can be easily increased by simply increasing the length of the first guide rails 4A, the second guide rails 4B and the output belts 33 in the first drive mechanism 2A and the second drive mechanism 2B. In addition, according to the present embodiment, the first drive mechanism 3A and the second drive mechanism 3B, as well as the motors M3, M4 for driving these mechanisms are supported by the guide member 1. Also, the first drive mechanism 3A and the motor M3 are placed closely to each other, as well as the second drive mechanism 3B and the motor M4 are so. Such an ingenuity in component layout enables relatively simple structure of the drive mechanisms 3A, 3B which encompass power transmission from the motors M3, M4 to the transfer carriages 2A, 2B, in the use of belt transmission system which has a high level of adaptability to ever increasing distance of the reciprocating travel range of the first transfer carriage 2A and the second transfer carriage 2B. Specifically, the first drive mechanism 3A and the second drive mechanism 3B have a compact structure, with the motors M3, M4 being linked with their respective drive pulleys 31b only via an output shaft and a reduction gear 172. The simple structure of the drive mechanism 3A, 3B as described enables to shorten the power transmission route from the motors M3, M4 to the respective transfer carriages 2A, 2B, and to reduce transmission loss of the driving power in the drive mechanisms 3A, 3B. As a result, the motors M3, M4 may be provided by those which have a relatively small output capacity, which contributes to space saving and power saving.

Further, according to the present embodiment, the motors M3, M4 which drive the first drive mechanism 3A and the second drive mechanism 3B are placed in an air-tight motor housing 17, i.e. in a sealed space which communicates with the inside space of the fixed base 200. With this arrangement, the sealed space in the fixed base 200 is enlarged to a portion (motor housing 17) which is supported by the guide member 1, thereby allowing the motors M3, M4 to be placed closely to the respective drive mechanisms 3A, 3B and in the atmospheric environment sealed against the outside vacuum environment. Further, it becomes possible to route power supply cables for the motor M3, M4 through the tubes 18 and the housing 14 into the fixed base 200.

Further, according to the present embodiment, the motor M3 and the motor M4 are separated from each other along the transfer path GL. In this arrangement, the motors and relevant components which represent substantial weight are divided and placed at two longitudinal end portions of the guide member 1. Therefore, it is possible to achieve a good weight balance of the guide member 1, which provides advantages in achieving rigidity of the structure for rotatably supporting the guide member 1 and in preventing accuracy deterioration due to deformation of the guide member 1.

According to the present embodiment, the first drive mechanism 3A and the second drive mechanism 3B are disposed in a point-symmetry relationship with respect to the center of the guide member 1, with a well balanced layout of the motor M3 and the motor M4. Such a layout ingenuity enables to use the same structure for both of the first drive mechanism 3A and the second drive mechanism 3B, making possible to reduce manufacturing cost, and to avoid complexity in the structure of drive mechanism even if the two transfer carriages 2A, 2B are to be driven independently from each other.

Still further, each of the first drive mechanism 3A and the second drive mechanism 3B is provided with a tensioner 32 for providing tension to the output belt 33. This simplifies belt routing structure while allowing the belt drive mechanism to operate appropriately.

It should be noted here that the linear transfer mechanism and the transfer robot according to the present invention is not limited to those described in the embodiment.

For example, in the embodiment described above, a timing belt is used as the output belt 33 for the first drive mechanism 3A and the second drive mechanism 3B, but the present invention is not limited to this. Alternatively, a flat belt, steel belt or wire may be used for example.

The transfer robot is not limited to those which have the first transfer carriage 2A and the second transfer carriage 2B. For example, the robot may be a one-hand robot which has the first transfer carriage 2A and the first drive mechanism 3A only. Again, in this case, it is possible to appropriately adapt to increase in the size of work and in the distance of transportation.

The embodiment is described on the assumption that the invention is for application to use in a vacuum; obviously however, the transfer robot according to the present invention can be built as one for use in the atmospheric environment.

The invention claimed is:

1. A linear transfer mechanism comprising:
   a guide member supported above a fixed base, the fixed base defining a first accommodating space that accommodates a swivel mechanism for swiveling the guide member, the guide member defining a second accommodating space above the first accommodating space;
   a transfer carriage movable along a horizontal linear transfer path provided on the guide member;
   a drive mechanism including a drive pulley and an output belt wound around the drive pulley for reciprocating movement in a predetermined reciprocating movement section in parallel to the transfer path; and
   a drive source for driving the drive pulley;
   wherein the transfer carriage is connected with the output belt of the drive mechanism by a connecting member,
   wherein both the drive mechanism and the drive source are accommodated in the second accommodating space.

2. The linear transfer mechanism according to claim 1, wherein the drive source is adjacent to the transfer carriage.

3. The linear transfer mechanism according to claim 1, wherein the drive mechanism includes a tensioner for tensioning the output belt.

4. The linear transfer mechanism according to claim 1, wherein the transfer carriage comprises a first transfer carriage and a second transfer carriage each supported by the guide member and movable along the transfer path without interfering with each other,
   wherein the drive mechanism comprises a first drive mechanism and a second drive mechanism provided in the second accommodating space of the guide member for driving the first transfer carriage and the second transfer carriage respectively,
   wherein the drive source comprises a first drive source and a second drive source provided in the second accommodating space of the guide member for driving the first drive mechanism and the second drive mechanism respectively.

5. The linear transfer mechanism according to claim 4, wherein the first drive source and the second drive source are spaced from each other in a direction parallel to the transfer path.

6. A transfer robot comprising:
a linear transfer mechanism according to claim 1;
the fixed base supporting the linear transfer mechanism in a manner such that the transfer mechanism is rotatable about a vertical swivel axis in the transfer path; and
a hand provided on the transfer carriage and configured to carry a thin work.

7. The transfer robot according to claim 6, further comprising a housing for containing the drive source in a hermetically sealed state, wherein the housing is connected to a channel for communicating with the fixed base with the hermetically sealed state maintained.

* * * * *